(12) United States Patent
Li et al.

(10) Patent No.: US 9,312,681 B2
(45) Date of Patent: Apr. 12, 2016

(54) CIRCUIT INTERRUPTER WITH OVER-TEMPERATURE PROTECTION FUNCTION FOR POWER CORD

(71) Applicant: Chengli Li, Suzhou (CN)

(72) Inventors: Chengli Li, Suzhou (CN); Guolan Yue, Suzhou (CN)

(73) Assignee: Chengli Li, Suzhou (CN)

( * ) Notice: Subject to any disclaimer, the term of this patent is extended or adjusted under 35 U.S.C. 154(b) by 2 days.

(21) Appl. No.: 14/497,668

(22) Filed: Sep. 26, 2014

(65) Prior Publication Data

US 2015/0349517 A1 Dec. 3, 2015

(30) Foreign Application Priority Data

May 28, 2014 (CN) .......................... 2014 1 0229297
Jun. 24, 2014 (CN) .......................... 2014 1 0286929

(51) Int. Cl.
*H02H 3/00* (2006.01)
*H02H 9/08* (2006.01)
*H02H 5/04* (2006.01)
*H02H 3/16* (2006.01)

(52) U.S. Cl.
CPC ................ *H02H 5/047* (2013.01); *H02H 3/16* (2013.01); *H02H 3/162* (2013.01); *H02H 5/04* (2013.01)

(58) Field of Classification Search
CPC ................................. H02H 5/047; H02H 9/08
USPC ............................................................ 361/42
See application file for complete search history.

(56) References Cited

U.S. PATENT DOCUMENTS

| | | | |
|---|---|---|---|
| 8,514,537 B2 * | 8/2013 | Higuchi .............. | H02P 29/0088 361/103 |
| 2005/0146824 A1 * | 7/2005 | Borrego Bel .......... | H02H 3/023 361/103 |
| 2005/0231876 A1 * | 10/2005 | Komatsu ................ | H01H 1/605 361/103 |
| 2011/0134575 A1 * | 6/2011 | Ward ..................... | G01K 3/005 361/42 |

* cited by examiner

*Primary Examiner* — Dharti Patel
(74) *Attorney, Agent, or Firm* — Chen Yoshimura LLP

(57) ABSTRACT

A power cord having a circuit interrupter such as a leakage current detection interrupter (LCDI) or arc fault circuit interrupter (AFCI), with a detection signal conductor wire in addition to the current carrying wires between the source and the load, and a temperature controlled switch coupled to the detection signal conductor wire on the load side. The temperature controlled switch is affixed to a device under measurement which is associated with the load, and changes its open or closed state when the device overheats. This in turn changes the state of the current flowing in the detection signal conductor wire. In response thereto, the circuit interrupter, which is coupled to the detection signal conductor wire on the source end, interrupts the power supply to the load.

10 Claims, 11 Drawing Sheets

CIRCUIT INTERRUPTER WITH OVER-TEMPERATURE PROTECTION FUNCTION FOR POWER CORD

BACKGROUND OF THE INVENTION

1. Field of the Invention

This invention relates to electrical devices for household use, and in particular, it relates to a circuit interrupter such as leakage current detection interrupter (LCDI) or arc fault circuit interrupter (AFCI) with over-temperature protection function, used to provide power for home appliances.

2. Description of the Related Art

With the wide use of electrical appliances in home, much attention is paid to the safety of these devices. Currently, various electrical appliances are provided with an integrated power cord about 1 meter long for supplying power. To improve safety, some products are available that have leakage current interruption function. However, they still have some shortcomings. When the power cord is used over long period of time, and the leakage current detection wire is broken, the product will lose its leakage current interruption function. But because the user is not aware that these functions are lost, they can continue to use these devices, causing safety concerns. Also, when key components of the appliance (such as the compressor and electric motor of air conditioner, dehumidifier, and refrigerator) have defects, the current can gradually increase, causing the surface temperature of the compressor to rise, eventually causing fire hazard.

Therefore there is the need for a low cost and reliable product with leakage current interruption and over-temperature interruption functions that has a self-testing capability, so that when the leakage current interruption and over-temperature interruption functions are lost, the circuit will trip automatically after reset, to disconnect the power so that the user cannot continue to use the product.

SUMMARY OF THE INVENTION

To solve the above problems, the present invention provides a low cost and reliable circuit interrupter device such as leakage current detection interrupter (LCDI) device or arc fault circuit interrupter (AFCI), for detecting abnormal heating of key components of electrical appliances and providing protection against it.

In one aspect, the present invention provides an electrical connection device which includes: an input connector for connecting to the power source on the input side; and an output connector for connecting to an electrical appliance on the output side; wherein when there is a leakage current in the current-carrying wires, or any of the current-carrying wires is open, or a temperature of the electrical appliance exceeds a predefined range, or the leakage current detection wire is broken, the electrical connection device disconnects its electrical connection with the power source.

In another aspect, the present invention provides an electrical appliance which includes: a plug for connecting to the power source to form an electrical connection; wherein when there is a leakage current in the current-carrying wires, or any of the current-carrying wires is open, or a temperature of the electrical appliance exceeds a predefined range, or the leakage current detection wire is broken, the electrical appliance disconnects its electrical connection with the power source.

In another aspect, the present invention provides a leakage current detection interrupter (LCDI) device which includes: a leakage current detection unit, including multiple current-carrying wires and at least one leakage current detection wire for detecting a leakage current of the current-carrying wires; and a temperature controlled module having at least one temperature controlled switch disposed on a device under measurement, the temperature controlled switch being coupled between the leakage current detection wire and a phase wire or neutral wire of the current-carrying wires, the temperature controlled module changing its connection state based on a detected temperature of the device under measurement.

In another aspect, the present invention provides a circuit interrupter device which includes: input terminals adapted for connecting to a power source; a cord having multiple current-carrying wires including a phase wire and a neutral wire for carrying a current from the power source at an input end to a load at an output end, and further having a detection signal conductor wire extending between the input end and the output end; a temperature controlled module having at least one temperature controlled switch adapted to be disposed on a device under measurement which is associated with the load, the temperature controlled switch being coupled between the detection signal conductor wire and either the phase wire or the neutral wire of the current-carrying wires at the output end of the cord, the temperature controlled switch changing its connection state based on a detected temperature of the device under measurement; a reset switch coupled between input ends of the current-carrying wires and the input terminals for electrically connecting or disconnecting the current carrying wires and the input terminals; and a switching control circuit for controlling the opening and closing of the reset switch, the switching control circuit being connected to the detection signal conductor wire at the input end of the cord, the switching control circuit controlling the reset switch to disconnect the current-carrying wires from the input terminals based on the open or closed stated of the temperature controlled switch.

Preferably, the temperature controlled switch includes: a switching unit, including a temperature-sensitive metal plate, a first metal plate and a second metal plate, wherein the temperature-sensitive metal plate controls an electrical connection or disconnection between the first metal plate and second metal plate based on temperature induced deformation. The temperature controlled switch further includes: a casing accommodating the switching unit; a sealing plate, having holes for respectively passing a first conductor coupled to the first metal plate and a second conductor coupled to the second metal plate; wherein the sealing plate and the casing are joined together to form a sealed space for accommodating the switching unit.

By using the temperature controlled module, the leakage current unit and the phase protection unit, this invention achieves an LCDI with self-testing function. Compared to conventional technologies, when the leakage current detection wire or the current-carrying wires are broken, the LCDI of the present invention can disconnect the electrical connection between the appliance and the power source, ensuring the safety of the appliance and enhancing the quality of the electrical grid.

BRIEF DESCRIPTION OF THE DRAWINGS

By referring to the embodiments described below with reference to the drawings, the present invention can be understood along with other objectives, specifics, characteristics and advantages. In the drawings.

DETAILED DESCRIPTION OF THE PREFERRED EMBODIMENTS

Figure 1:
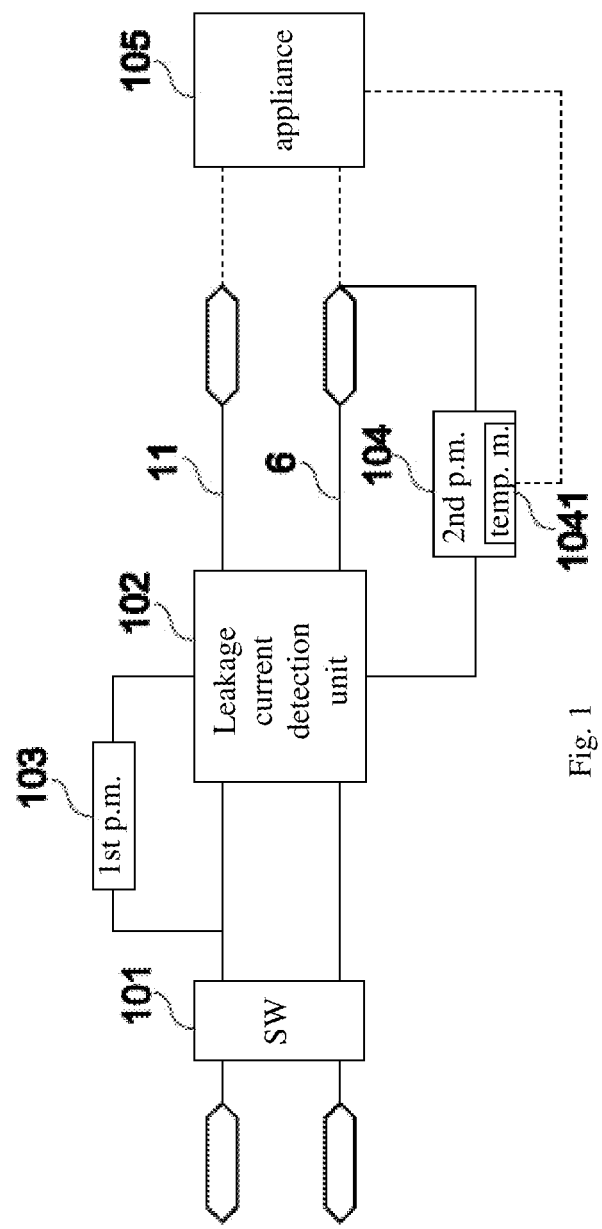
FIG. 1 is a block diagram of the LCDI device according to embodiments of the present invention.

The preferred embodiments of the present invention are described in detail below with reference to the drawings. Although the preferred embodiments are shown in the drawings, it should be understood that the invention can be realized in various ways and is not limited to the embodiments described here. Instead, these embodiments are provided to make the disclosure more thorough and complete, and to convey the disclosure to those skilled in the art.

FIG. 1 is a block diagram of the LCDI device according to embodiments of the present invention.

The LCDI device includes: (1) switching unit 101, for controlling the electrical connection between the power source and the appliance on the input side; (2) leakage current detection unit 102, including multiple current-carrying wires and at least one leakage current detection wire for detecting a leakage current in the current-carrying wires; (3) a phase protection unit, coupled to an input side of at least one current-carrying wire of the multiple current-carrying wires, and coupled to an output side of at least another current-carrying wire of the multiple current-carrying wires, to form at least one current loop between the input side of the one current-carrying wire and the output side of the other current-carrying wire via the leakage current detection unit and the phase protection unit.

Preferably, the phase protection unit includes: (1) a first phase module 103, coupled to the input side of the one current-carrying wire (e.g. the first current-carrying wire) and the leakage current detection unit 102; (2) a second phase module 104, coupled to the output side of the other current-carrying wire (e.g. the second current-carrying wire) and the leakage current detection unit 102.

Optionally, the first phase module 103 may include at least one first phase branch. For example, when the power source is a multi-phase system, each phase having a current-carrying wire, multiple first phase branches can be respectively coupled to the current-carrying wire of each phase on the input side, and coupled to the leakage current detection unit 102.

Similarly, the second phase module 104 may include at least one first phase branch. For example, when the power source is a multi-phase system, each phase having a current-carrying wire, multiple second phase branches can be respectively coupled to the current-carrying wire of each phase on the output side, and coupled to the leakage current detection unit 102.

It should be understood that when the first and second phase modules 103 and 104 each have only one phase branch, the phase branches cannot be connected to the same current-carrying wire, because they will not be able to form a current loop. But when both modules have two or more phase branches each, these phase branches can be connected to the current-carrying wires of the multiple phases, and current loops can be formed between the current-carrying wires of different phases.

Preferably, to provide an over-temperature interruption function for the device, the second phase module 104 may include a temperature controlled module 1041 having at least one temperature controlled switch. The temperature controlled switch can detect the temperature of a device under measurement; for example, the temperature controlled switch can be located on or near the device under measurement (such as the appliance 105), and can determine whether to disconnect the power source based on the temperature of the device under measurement.

In other words, when the temperature controlled switch detects a temperature above a first predefined temperature or below a second predefined temperature, it will changes its connection state to generate the control signal. The control signal can, via the leakage current detection unit, cause the switch unit 101 to open so as to disconnect the power source.

Figure 2A:
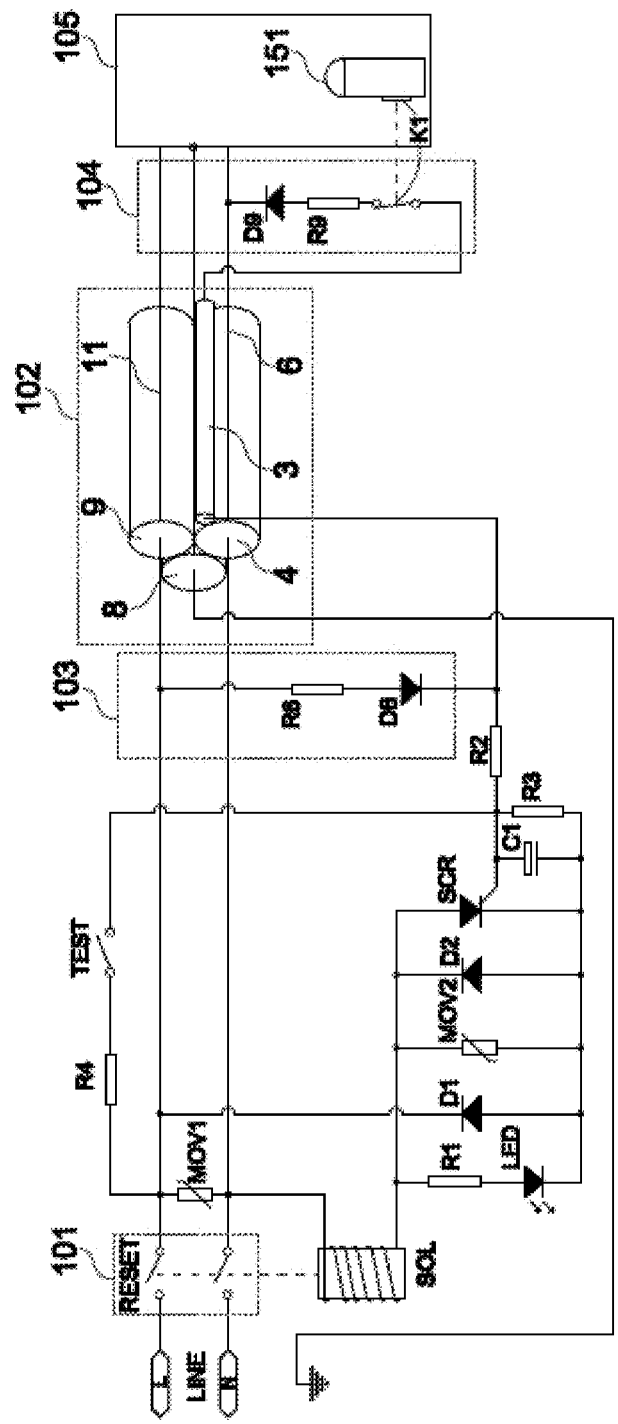
FIG. 2a illustrates an LCDI according to a first embodiment of the present invention.
Figure 2B:
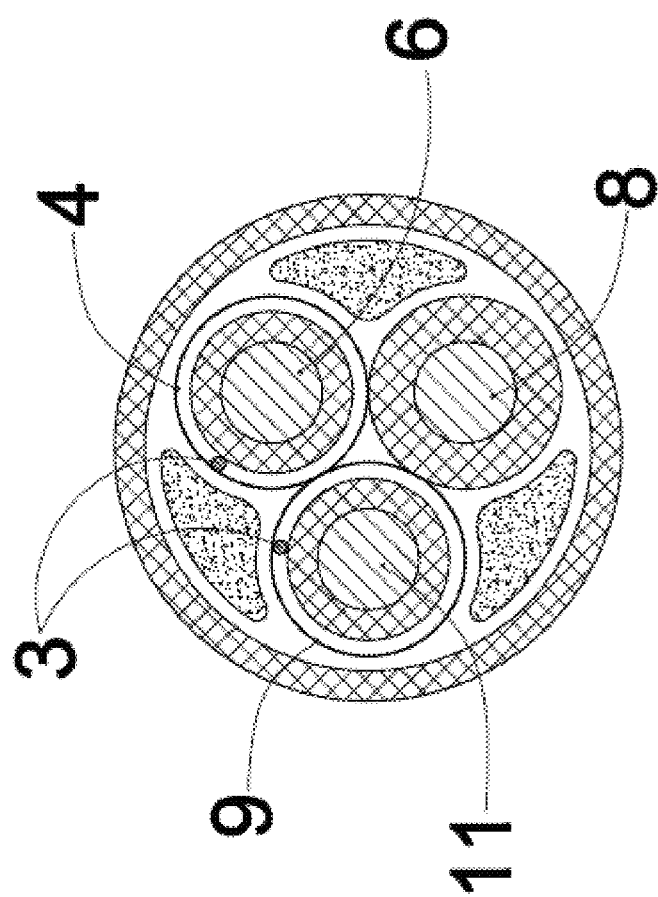
FIG. 2b illustrates a leakage current detection wire according to an embodiment of the present invention.

FIG. 2a illustrates an LCDI according to a first embodiment of the present invention; FIG. 2b illustrates a leakage current detection wire according to an embodiment of the present invention.

The LCDI includes: (1) switch unit 101, including two reset switches RESET respectively provided on the two current-carrying wires (neutral and phase wires), which can, under the action of the solenoid SOL, disconnect or connect the electrical connection between the power source and the appliance; (2) a leakage current detection unit 102, including current-carrying wires 6, 8 and 11, and leakage current detection wire 3 for detecting a leakage current of the current-carrying wires; (3) a phase protection unit, including a first phase module 103 having resistor R6 and diode D6, and a second phase module 104 having resistor R9 and diode D9.

Further, the LCDI includes a silicon controlled rectifier SCR, diodes D1 and D2, capacitor C1, resistors R2 and R3, and a trip solenoid SOL having a core. The control electrode of the silicon controlled rectifier SCR is coupled between the resistors R2 and R3 and coupled to the leakage current detection wire 3 via resistor R2. The resistor R3 and capacitor C1 are connected in parallel between the control electrode and the cathode of the silicon controlled rectifier SCR. It can be seen that these two elements can regulate and filter the signal inputted to the control electrode of the silicon controlled rectifier SCR, improving the resistance of the silicon controlled rectifier SCR against interference of external signals.

On the input side, one end of the first phase module 103 is coupled to the phase line, and the other end of it is coupled to an end of the leakage current detection wire 3. On the output side, one end of the second phase module 104 is coupled to the other end of the leakage current detection wire, and the other end of it is coupled to the neutral line. Therefore, the first and second phase branches and the leakage current detection wire 3 form an electrical current path from the phase line to the neutral line. It can be understood that the first phase module 103 can be connected to the neutral line and the second phase module 104 can be connected to the phase line. Similarly, the polarities of diodes D6 and D9 in FIG. 2a are such that they are effective in the positive half cycles of the AC source; if their polarities are reversed, then they function in the negative half cycles. The resistors R6 and/or R9 should be set so that the silicon controlled rectifier SCR will not conduct when there is no leakage current or over-temperature condition.

The current-carrying wires and the leakage current detection wire form a cord, which typically has a length on the order or a meter. Each of the current-carrying wires 6, 8 and 11 is enclosed by an insulating layer (e.g. rubber, plastic), and the insulating layers of the current-carrying wires 6 and 11 are further enclosed by metal conductor layers 4 and 9 respectively. The leakage current detection wire 3 is located between the metal conductors 4 and 9 and is in contact with them.

Preferably, another metal conductor layer may be used to enclose the leakage current detection wire 3, the metal conductors 4 and 9 and the insulating layer of the current-carrying wire 8, so as to shield the three current-carrying wires.

When a leakage current occurs between two of the current-carrying wires 6, 8 and 11, the leakage current detection wire 3 can detect the leakage current through the metal conductors 4 or 9. As a result, the leakage current detection wire 3 is charged, and forms an electrical current loop with resistors R2 and R3, capacitor C1, diodes D1 or D2. This forms a positive voltage drop on the resistor R3, which triggers the silicon controlled rectifier SCR to conduct. This in turn generates a current in the trip solenoid SOL. When the leakage current detection wire 3 does not detect a leakage current, the silicon controlled rectifier SCR does not conduct.

When the reset switch RESET of the LCDI is depressed, the appliance 105 is started, a compressor 151 functions normally, and the temperature controlled switch K1 is in the closed position.

When the compressor 151 has a defect, fault or other problems causing its internal current to increase, the compressor 151 will heat up and its surface temperature will continue to rise. When the surface temperature of the compressor 151 reaches the predefined threshold temperature for the temperature controlled switch K1, heat deformation causes the temperature controlled switch K1 on the compressor 151 to change from a closed state to an open state. Thus, components R6, D6, leakage current detection wire 3, temperature controlled switch K1, R9 and D9 cannot form an electrical current loop; R6 and D6 provide a high voltage for R2 at the control electrode of the silicon controlled rectifier SCR. This triggers the silicon controlled rectifier SCR to conduct, driving a current in the trip solenoid SOL; as a result, the core inside it moves, causing the reset switch RESET linked to the core to trip, disconnecting the electrical connection between the input side and the output side. This ensures the safety of the electrical appliance.

It should be understood that the protection temperature of the temperature controlled switch K1 can be set beforehand according to the specific requirements of the appliance. The temperature controlled switch K1 is not limited to heat deformation type of switch.

Similarly, when the leakage current detection wire 3 is open at anywhere along it, and thus cannot effectively detect the leakage current of the current-carrying wires, the components R6, D6, leakage current detection wire 3, temperature controlled switch K1, R9 and D9 likewise cannot form an electrical current loop; R6 and D6 provide a high voltage for R2 at the control electrode of the silicon controlled rectifier SCR. This triggers the silicon controlled rectifier SCR to conduct, driving a current in the trip solenoid SOL; as a result, the core inside it moves, causing the reset switch RESET linked to the core to trip, disconnecting the electrical connection between the input side and the output side. This ensures the safety of the electrical appliance.

Based on the above principles, in the circuit of FIG. 2a, when the neutral line 6 of the current-carrying wires have an open circuit, the current loop between the first and second phase branches 103 and 104 is disconnected. This can directly raise the voltage at the control electrode of the silicon controlled rectifier SCR and trigger it to conduct.

Therefore, any of the following conditions will disconnect the RESET switch:

(1) The leakage current detection unit 102 detects a leakage current between current-carrying wires, and outputs a leakage current signal to cause the silicon controlled rectifier to conduct; and (2) The electrical path, formed between the phase line and the neutral line and passing through the phase protection unit and the leakage current detection wire, becomes an open circuit, for example, when the temperature controlled switch K1 is open due to heat, or when the leakage current detection wire 3 or the current-carrying wires 6 or 11 is broken.

Of course, this embodiment is only used to illustrate the principle of the invention; the conducting circuit can include other means to trigger the silicon controlled rectifier.

Figure 3:
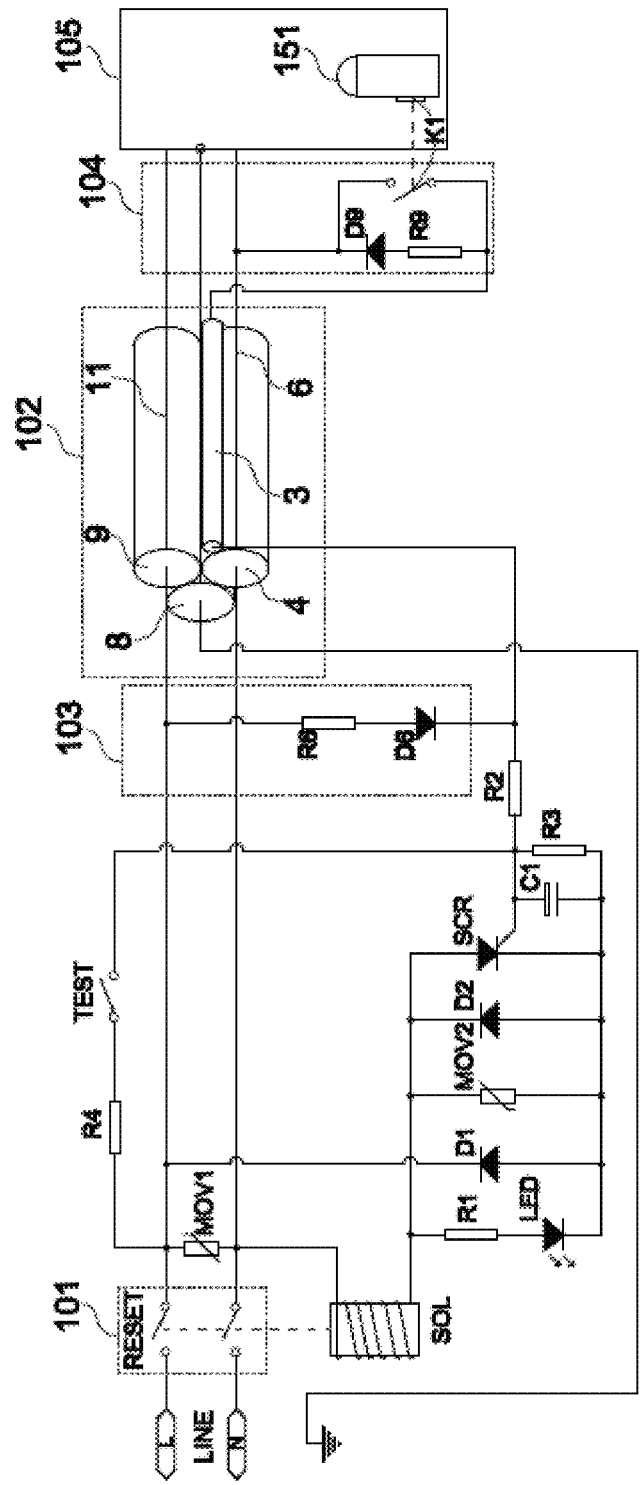
FIG. 3 illustrates an LCDI according to a second embodiment of the present invention.

FIG. 3 illustrates an LCDI according to a second embodiment of the present invention. This circuit is similar to the circuit of FIG. 2a except for the connection of the temperature controlled switch K1.

When the LCDI is working properly, and the RESET switch is depressed, components R6 and D6 provide a voltage to the leakage current detection wire 3; the leakage current detection wire 3 is in turn coupled to the neutral line N via R9 and D9 to form a current loop. The voltage on the control electrode R2 of the silicon controlled rectifier SCR is below its trigger voltage, so the LCDI functions normally.

When the surface temperature of the compressor 151 reaches the predefined threshold temperature for the temperature controlled switch K1, the temperature controlled switch K1 changes from an open state to a closed state. Because the switch K1 is connected in parallel with R9 and D9, when the switch K1 closes due to heat, a leakage current is generated between the leakage current detection wire 3 and the neutral line N. The silicon controlled rectifier SCR is triggered to conduct via R2, driving a current in the trip solenoid SOL; as a result, the core inside it moves, causing the reset switch RESET linked to the core to trip, disconnecting the electrical connection between the input side and the output side. This ensures the safety of the electrical appliance.

Figure 4:
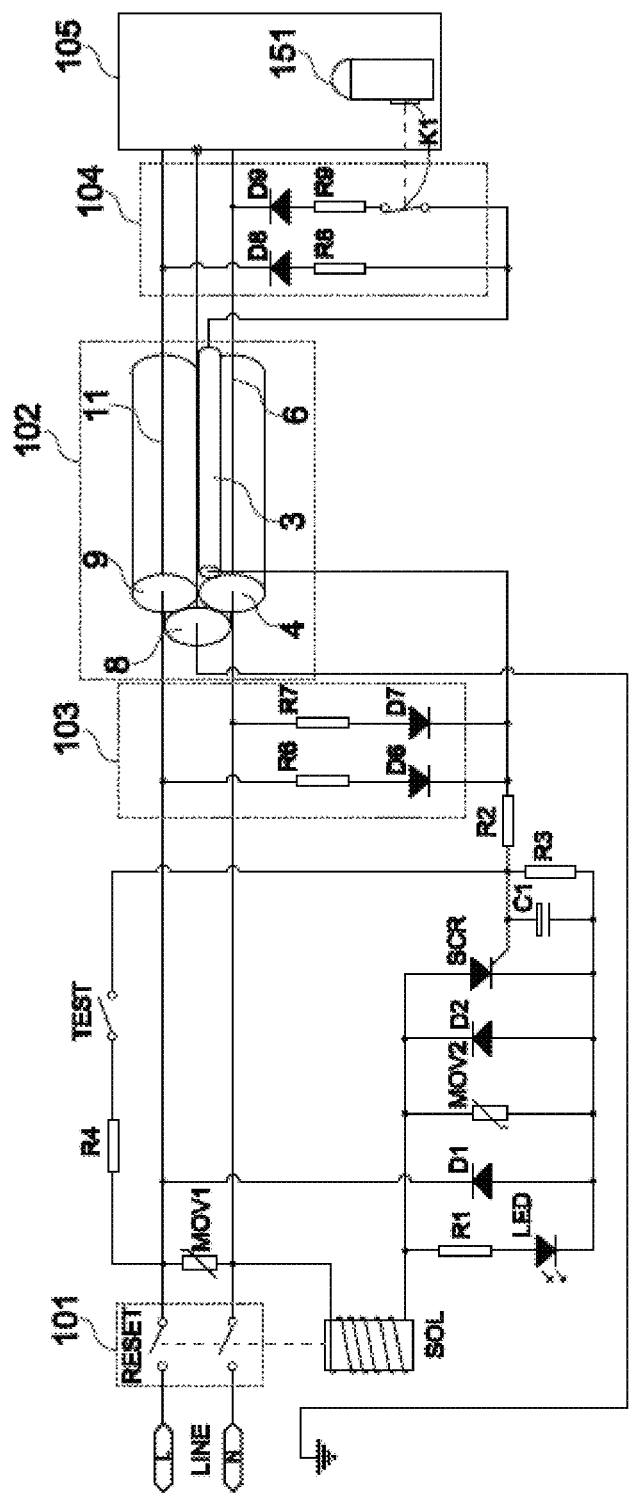
FIG. 4 illustrates an LCDI according to a third embodiment of the present invention.

FIG. 4 illustrates an LCDI according to a third embodiment of the present invention. This circuit is similar to the circuit of FIG. 2a but has additional phase branches D7, R7 and D8, R8.

When the LCDI is working properly, and the RESET switch is depressed, components R6, D6, leakage current detection wire 3, temperature controlled switch K1, R9 and D9 are connected to the neutral line N to form a current loop. The voltage on the control electrode R2 of the silicon controlled rectifier SCR is below its trigger voltage, so the LCDI functions normally.

Similarly, components R7, D7, leakage current detection wire 3, R8 and D8 are connected to the phase line L to form a current loop. The voltage on the control electrode R2 of the silicon controlled rectifier SCR is below its trigger voltage, so the LCDI functions normally.

When the compressor 151 has a defect, fault or other problems causing its internal current to increase, the compressor 151 will heat up and its surface temperature will continue to rise. When the surface temperature of the compressor 151 reaches the predefined threshold temperature for the temperature controlled switch K1, heat deformation causes the temperature controlled switch K1 on the compressor 151 to change from a closed state to an open state. Thus, components R6, D6, leakage current detection wire 3, temperature controlled switch K1, R9 and D9 cannot form an electrical current loop; R6 and D6 provide a high voltage for R2 at the control electrode of the silicon controlled rectifier SCR. This triggers the silicon controlled rectifier SCR to conduct, driving a current in the trip solenoid SOL; as a result, the core inside it moves, causing the reset switch RESET linked to the core to trip, disconnecting the electrical connection between the input side and the output side. This ensures the safety of the electrical appliance.

Similarly, when the leakage current detection wire 3 is open at anywhere along it, and thus cannot effectively detect the leakage current of the current-carrying wires, components R6, D6, leakage current detection wire 3, temperature controlled switch K1, R9 and D9 likewise cannot form an electrical current loop; R6 and D6 provide a high voltage for R2 at the control electrode of the silicon controlled rectifier SCR. This triggers the silicon controlled rectifier SCR to conduct, driving a current in the trip solenoid SOL; as a result, the core inside it moves, causing the reset switch RESET linked to the core to trip, disconnecting the electrical connection between the input side and the output side. This ensures the safety of the electrical appliance. This current loop can cause the RESET switch to trip when the neutral line 6 of the current-carrying wires is open. Clearly, in the case the leakage current detection wire 3 is open, the current branch formed by R7, D7, R8 and D8 can serve the same function as above. This current loop can also cause the RESET switch to trip when the phase line 11 of the current-carrying wires is open. Thus, in the circuit of FIG. 4, the RESET switch will trip when either the phase line 11 or the neutral line 6 is open.

Thus, in the circuit of FIG. 4, any of the following conditions will disconnect the RESET switch:

(1) The leakage current detection unit 102 detects a leakage current between current-carrying wires, and outputs a leakage current signal to cause the silicon controlled rectifier to conduct; and (2) The electrical path, formed between the phase line and the neutral line and passing through the phase protection unit and the leakage current detection wire, becomes an open circuit, for example, when the temperature controlled switch K1 is open due to heat, or when the leakage current detection wire 3 or any of the current-carrying wires 6 or 11 is broken.

It should be understood that more temperature controlled switches can be provided on other phase lines or the ground line.

Figure 5:
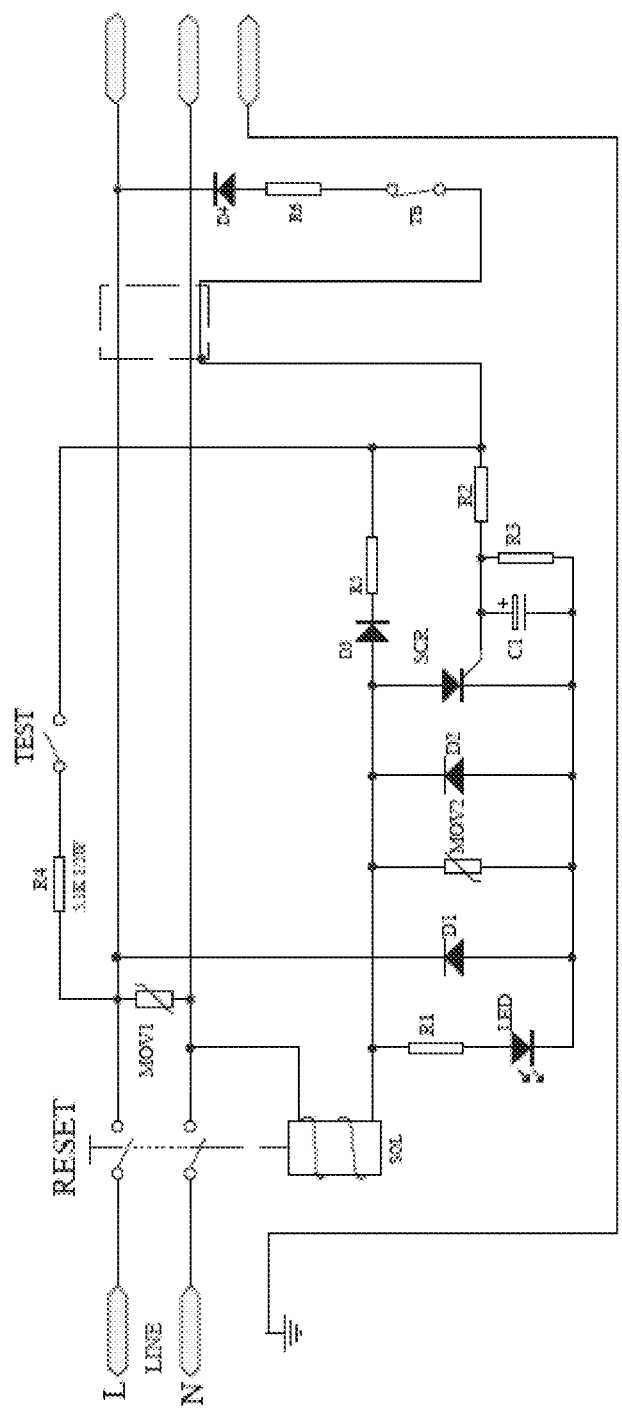
FIG. 5 illustrates an LCDI according to a fourth embodiment of the present invention.

FIG. 5 illustrates an LCDI according to a fourth embodiment of the present invention. This circuit is similar to the circuit of FIG. 2a, but the first phase module (D3, R5) on the line side is connected to the neutral line and the second phase module (D4, R6, TB) on the load side is connected to the phase line. The operating principle is similar to that of the circuit in FIG. 2a, i.e., by forming a current path between the phase and neutral lines (here, the current flows in the current path in the negative half cycle of the AC current). Note that the dashed line box denotes the structure where the phase and neutral wires are surrounded by respective conductor layers which are in contact with the leakage current detection wire (s), as shown in FIG. 2b.

To simultaneously measure the temperature of multiple devices under measurement, at least some of the multiple temperature controlled switches can be connected so that their one ends are all connected to the neutral line or phase line, and their other ends are connected to the leakage current detection wire, in order to detect the temperature of multiple devices under measurement.

Preferably, the switch structure includes a temperature-sensitive metal plate, a first metal plate and a second metal plate, where the temperature-sensitive metal plate controls the electrical connection or disconnection between the first metal plate and second metal plate based on temperature induced deformation.

Preferably, the temperature-sensitive metal plate is coupled to the second metal plate, and when the temperature-sensitive metal plate deforms due to heat, it springs upwards to connect to the first metal plate, forming the electrical connection between the first and second metal plates.

In practical applications, key components of the electrical appliance, such as the compressor, may generate relatively large or high frequency shaking. To achieve accurate temperature control in such conditions, the temperature controlled switch should be appropriately mounted on the device under measurement.

Preferably, the temperature controlled switch has a fixing member (not shown in the drawings) on its surface, to form a stable connection between the temperature controlled switch and the device under measurement, and to prevent inaccurate temperature measurement by the temperature controlled switch due to shaking.

The over-temperature protection function can also be implemented in an LCDI circuit that does not have a self-testing function. These embodiments are shown in FIGS. 5-7.

Figure 6:
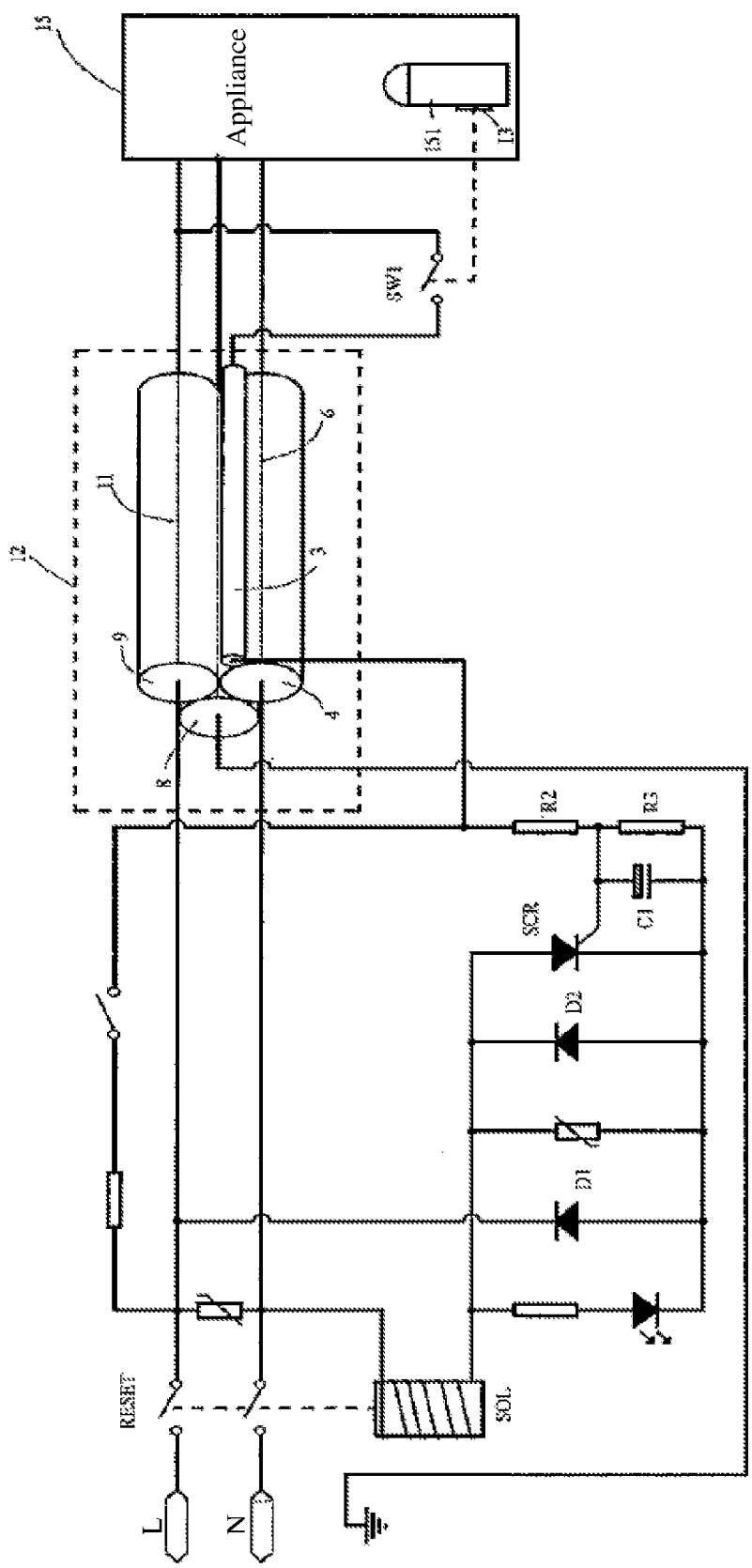
FIG. 6 illustrates an LCDI according to a fifth embodiment of the present invention.
Figure 7:
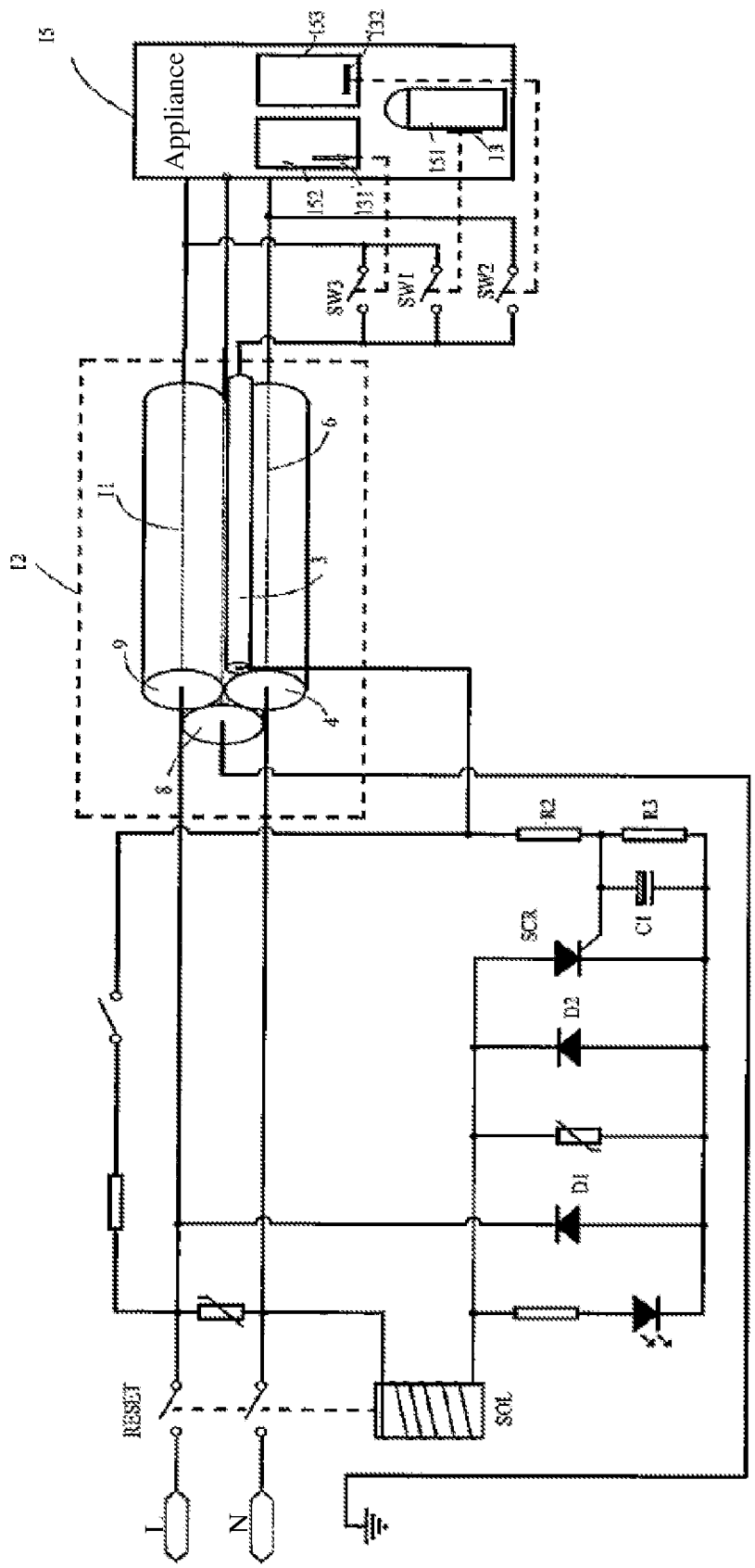
FIG. 7 illustrates an LCDI according to a sixth embodiment of the present invention.

FIG. 6 illustrates a fifth embodiment of the present invention. The LCDI device of this embodiment includes: (1) leakage current detection unit, including three current-carrying wires 6, 8, 11 and a leakage current detection wire 3; and (2) temperature controlled unit having a temperature controlled switch SW1. One end of the current-carrying wire 6 is connected to the neutral line (WHITE) via a conductor and a reset switch (RESET); another end of it is connected to the neutral terminal of the appliance 15. Similarly, the two ends of the current-carrying wires 8 and 11 are respectively connected to the ground line (GND) and phase line (HOT) and the ground line and phase terminals of the appliance (such as air conditioner, refrigerator, dehumidifier, etc.) The temperature controlled switch SW1 is located on the output side of the leakage current detection unit, and coupled between the leakage current detection wire 3 and either the phase line 11 or neutral line 6 of the current-carrying wires.

The leakage current detection unit including the current-carrying wires and the leakage current detection wire has the same structure as the leakage current detection unit shown in FIG. 2b.

Further, the LCDI includes a silicon controlled rectifier SCR, diodes D1 and D2, capacitor C1, resistors R2 and R3, and a trip solenoid SOL having a core. The control electrode of the silicon controlled rectifier SCR is coupled between the resistors R2 and R3 and coupled to the leakage current detection wire 3 via resistor R2. The resistor R3 and capacitor C1 are connected in parallel between the control electrode and the cathode of the silicon controlled rectifier SCR. It can be seen that these two elements can regulate and filter the signal inputted to the control electrode of the silicon controlled rectifier SCR, improving the resistance of the silicon controlled rectifier SCR against interference of external signals. The core disposed inside the trip solenoid SOL is linked to the reset switch RESET; when a current flows through the solenoid, the solenoid generates a magnetic field, causing the reset switch RESET to reset or trip, thereby controlling whether power is outputted from the plug.

When a leakage current occurs between two of the current-carrying wires 6, 8 and 11, the leakage current detection wire 3 can detect the leakage current through the metal conductors 4 or 9. As a result, the leakage current detection wire 3 is charged, and forms an electrical current loop with resistors R2 and R3, capacitor C1, diodes D1 or D2. This forms a positive voltage drop on the resistor R3, which triggers the silicon controlled rectifier SCR to conduct. This in turn generates a current in the trip solenoid SOL. When the leakage current detection wire 3 does not detect a leakage current, the silicon controlled rectifier SCR does not conduct.

When the reset switch RESET of the LCDI is depressed, the appliance 105 is started, a compressor 151 functions normally, and the temperature controlled switch SW1 (over-heating protecting device) is in the open position.

When the compressor 151 has a defect, fault or other problems causing its internal current to increase, the compressor 151 will heat up and its surface temperature will continue to rise. When the surface temperature of the compressor 151 reaches the predefined threshold temperature for the temperature controlled switch SW1, heat deformation causes the temperature controlled switch SW1 on the compressor 151 to change from an open state to a closed state. Thus, a leakage current signal is generated on the resistor R2 of the LCDI circuit. This triggers the silicon controlled rectifier SCR to conduct, driving a current in the trip solenoid SOL; as a result, the core inside it moves, causing the reset switch RESET linked to the core to trip, disconnecting the electrical connection between the input side and the output side. This ensures the safety of the electrical appliance and prevents fire. It should be understood that the protection temperature of the temperature controlled switch SW1 can be set beforehand according to the specific requirements of the appliance.

FIG. 7 illustrates a sixth embodiment of the present invention. Compared to the embodiment of FIG. 6, this embodiment additionally has switches SW2 and SW3. This circuit can generate a leakage current through the neutral line WHITE, and can simultaneously detect temperature at multiple points, including the measurement point 13 on the compressor, measurement point 131 on the control board and measurement point 132 on the motor of the fan. When the temperature at any of these points reaches the predefined threshold temperature, a leakage current signal is generated on the resistor R2 of the LCDI circuit. This triggers the silicon controlled rectifier SCR to conduct, driving a current in the trip solenoid SOL; as a result, the core inside it moves, causing the reset switch RESET linked to the core to trip, disconnecting the electrical connection between the input side and the output side. This ensures the safety of the electrical appliance and prevents fire. It should be understood that the protection temperature of the temperature controlled switch SW1 can be set beforehand according to the specific requirements of the appliance.

It should be understood that temperature controlled switches can be additionally provided on the other phase lines or the ground line.

To simultaneously measure the temperatures of multiple devices to be measured, the ends of at least some of the temperature controlled switches can be commonly connected to the neutral line or phase line, while the other ends of the multiple temperature controlled switches is coupled to the leakage current detection wire, to simultaneously measure the temperatures of multiple devices.

As shown in FIG. 7, the left end of the temperature controlled switches SW1 to SW3 are coupled to the leakage current detection wire 3; the right end of switches SW1 and SW3 are coupled to the phase wire, and the right end of switch SW2 is coupled to the neutral wire.

It should be understood that the right end of temperature controlled switches SW1 to SW3 can be all coupled to the phase wire or the neutral wire; or some of them may be coupled to the phase wire and some coupled to the neutral wire.

Figure 8:
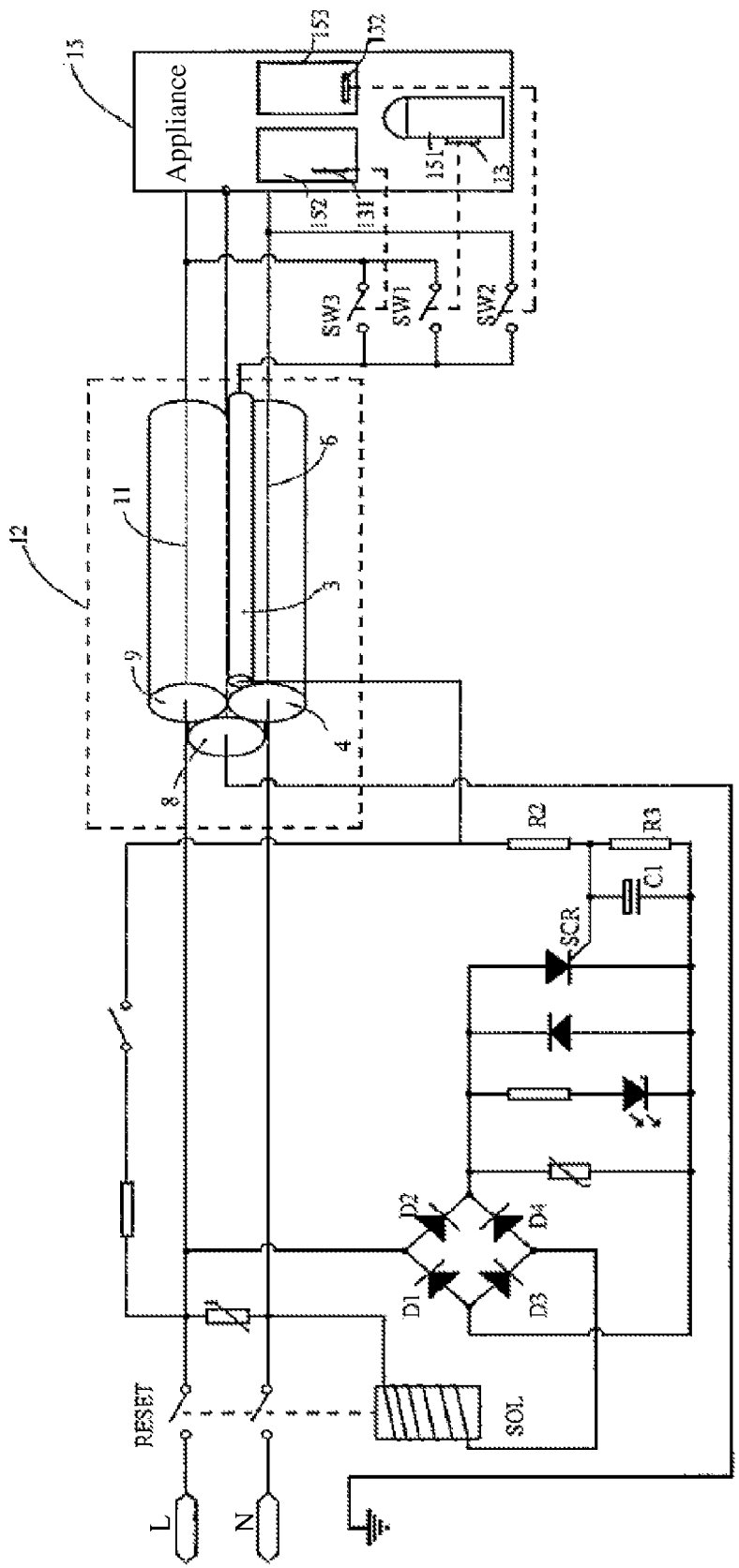
FIG. 8 illustrates an LCDI according to a seventh embodiment of the present invention.

FIG. 8 illustrates a seventh embodiment of the present invention. Compared to the embodiment of FIG. 7, a rectifier bridge D1-D4 is coupled between the trip solenoid SOL and the silicon controlled rectifier, and diode D1 in FIG. 7 can be omitted.

In the above embodiments, the conductor wire 3 serves (1) the function of detecting a leakage current between the current carrying wires in the cord, as well as (2) the function of forming a current loop with the temperature controlled switch K1 or SW1 to allow the opening or closing of the temperature controlled switch to generate a trip signal. For the purpose of providing over-temperature protection, the conductor wire 3 only needs to serve the second function. In other words, the conductor wire 3 does not need to be a leakage current detection wire; it only needs to be a conductor wire that conducts between the line side and load side of the cord.

Figure 9:
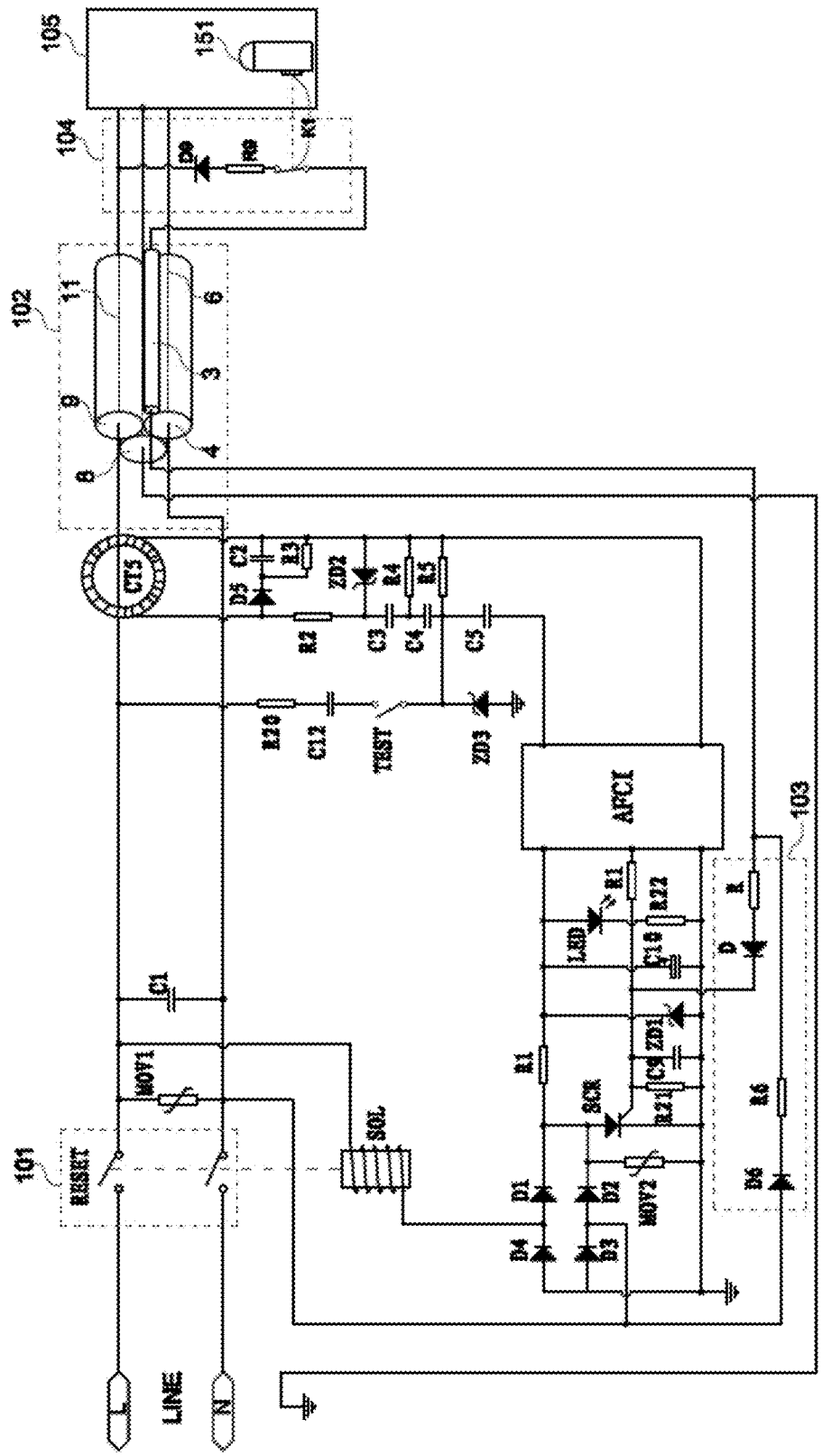
FIG. 9 illustrates an arc fault circuit interrupter (AFCI) circuit according to an eighth embodiment of the present invention.

Beside leakage current detection interrupter (LCDI) devices, the temperature controlled switch can also be employed in other types of interrupter circuits, such as arc fault circuit interrupter (AFCI) devices. FIG. 9 illustrates an eighth embodiment of the present invention, which employs a temperature controlled unit having a temperature controlled switch K1 in an AFCI device. The AFCI circuit can detect an arc fault between the phase and neutral lines, phase and phase lines or phase and ground lines in electrical wirings. In this circuit, components CT5 (detector ring), D5, C2, R3, R2, ZD2, C3, R4, C4, R5 and C5 form a circuit that generates an input signal to the AFCI detection chip when an arc fault occurs. In response, the AFCI detection chip outputs a control signal via R1 to trigger the silicon-controlled rectifier SCR to conduct. As a result, a current flows through the trip solenoid SOL to open the RESET switch and disconnect the power. A more detailed description of the AFCI circuit can be found in co-pending application Ser. No. 14/306,686, filed Jun. 17, 2014.

In the circuit of FIG. 9, a current path is formed from the neutral line on the line side, through diode D6 and resistor R6, conductor wire 3 in the cord 102, temperature-controlled switch K1, resistor R9 and diode D9 to the phase line on the load side. The temperature controlled switch K1 is normally closed. If the appliance 151 overheats, the temperature controlled switch K1 becomes open, and the current path cannot be formed. As a result, during the negative half cycle of the AC power supply, D6 and R6 provide a high voltage for resistor R at the control electrode of the SCR. As a result, the SCR conducts, a current flows through the SOL, and the RESET switch is open to disconnect the power.

Alternatively, the temperature controlled switch K1 can also be connected in parallel with D9 and R9 and be in a normally open state, similar to the configuration of unit 104 in FIG. 3.

In the circuit of FIG. 9, the conductor wire 3 is not required to detect a leakage current in the wires 6, 8 and 11.

Figure 10A:
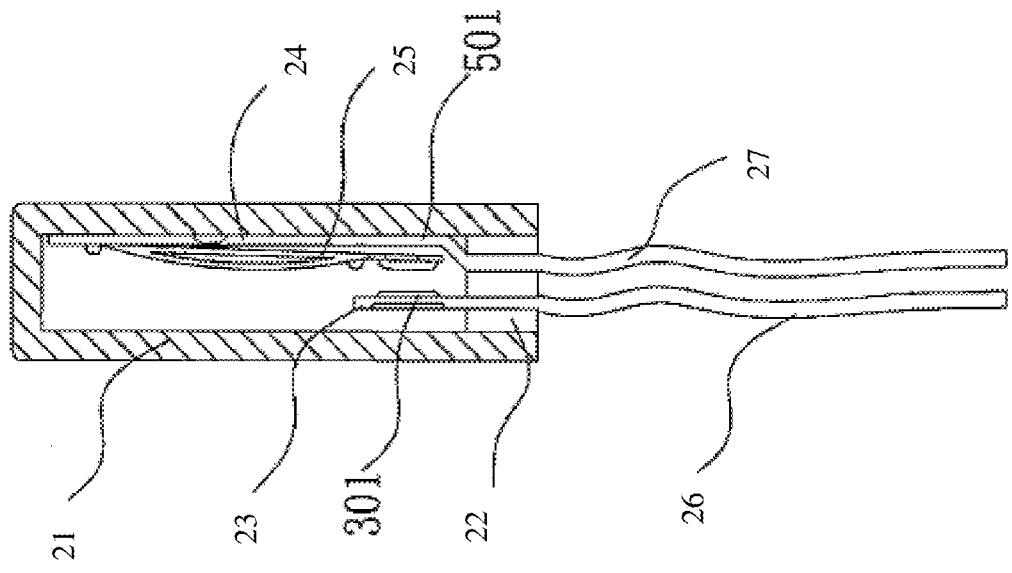
FIG. 10a is a cross-sectional view of a temperature-controlled switch of embodiments of the present invention in an open state.
Figure 10B:
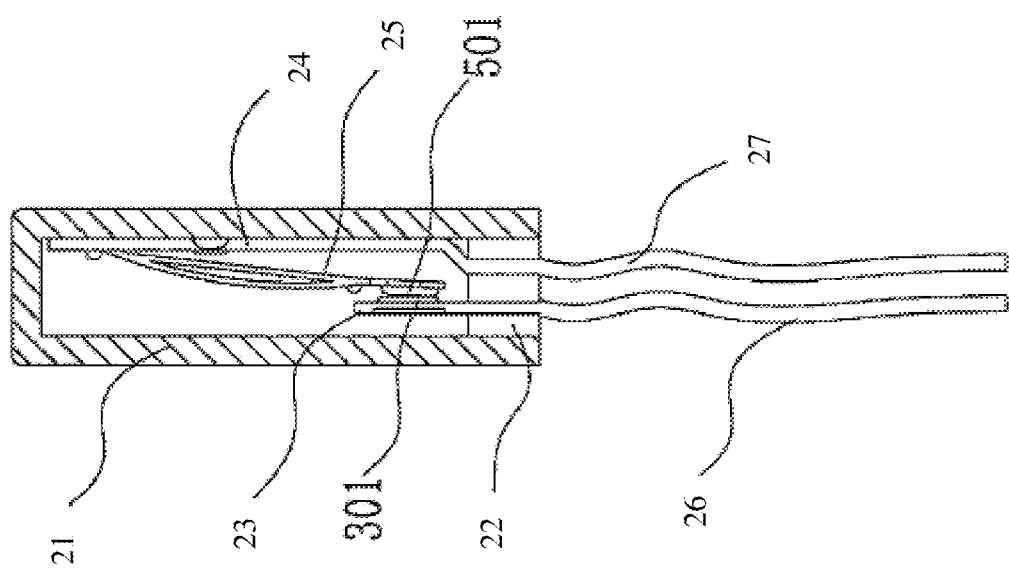
FIG. 10b is a cross-sectional view of the temperature-controlled switch of embodiments of the present invention in a closed state.

FIG. 10a is a cross-sectional view of a temperature-controlled switch of embodiments of the present invention in an open state, and FIG. 10b is a cross-sectional view of the temperature-controlled switch of embodiments of the present invention in a closed state.

The temperature-controlled switch includes a switching component, which includes temperature sensitive metal plate 25, first metal plate 23, and second metal plate 24. The temperature sensitive metal plate 25 deforms based on temperature to control the electrical connection and disconnection between the first metal plate 23 and the second metal plate 24.

Preferably, the temperature sensitive metal plate 25 is coupled to the second metal plate 24; when it deforms under heat, it springs up to a certain distance to come into contact with the first metal plate 23, thereby completing the electrical connection of the first and second metal plates.

Preferably, the temperature-controlled switch includes a casing 21, sealing plate 22, first conductor 26 coupled to the first metal plate 23 and second conductor 27 coupled to the second metal plate 24. The casing 21 is for accommodating the switching component, and the sealing plate 22 has holes for respectively passing the first conductor 26 and the second conductor 27. The sealing plate 22 and the casing 21 are joined together to form a sealed space for accommodating the switching component.

Preferably, the casing 21 and sealing plate 22 may be made of plastic, rubber or other materials, to protect the temperature-controlled switch from dust, water, and electrical current, which enhances its reliability. Similarly, the casing may be made of metal, so long as the metal casing 21 and the switching component are electrically insulated from each other. This design is also reliable.

The first metal plate 23 and the temperature sensitive metal plate 25 respectively have contact terminals 301, 501 which form an electrical connection under certain temperatures. The first conductor 26 is coupled to the leakage current detection wire 23 and the second conductor is coupled to the phase or neutral line.

The temperature-controlled switch is placed at a position where temperature detection is desired, such as the compressor, fan, electric motor and control board of electrical appliances. When these components of the appliance is overheated to above the predetermined temperature, the temperature sensitive metal plate 25 deforms, causing contact terminals 301, 501 to close, forming an electrical connection. This opens the reset switch RESET, thereby disconnecting the electrical connection between the power lines and the appliance 15. Then, when the detected temperature drops below the predetermined temperature, the temperature sensitive metal plate 25 returns to the original shape, disconnecting the electrical connection between terminals 301, 501.

Those skilled in the art should appreciate that the above descriptions are illustrative only and do not limit the scope of the present invention. Those skilled in the art should also appreciate that the various exemplary logic units, modules, circuits and algorithms described in the embodiments can be implemented in hardware or software or their combination. To clearly illustrate the interchangeability of hardware and software, the various exemplary parts, components, modules, circuits and method steps are described using functional descriptions. Whether the functions are implemented in hardware or software depends on the particular applications and design limitations of the system. Those skilled in the art can implement the above described functions using various modifications for particular applications, and such implementation decisions are within the scope of the invention.

What is claimed is:

1. A circuit interrupter device comprising:
   input terminals adapted for connecting to a power source;
   a cord having multiple current-carrying wires including a phase wire and a neutral wire for carrying a current from the power source at an input end to a load at an output end, and further having a detection signal conductor wire extending between the input end and the output end;
   a temperature controlled module having at least one temperature controlled switch adapted to be disposed on a device under measurement which is associated with the load, the temperature controlled switch being coupled between the detection signal conductor wire and either the phase wire or the neutral wire of the current-carrying wires at the output end of the cord, the temperature controlled switch changing its connection state based on a detected temperature of the device under measurement;
   a reset switch coupled between input ends of the current-carrying wires and the input terminals for electrically connecting or disconnecting the current carrying wires and the input terminals; and
   a switching control circuit for controlling the opening and closing of the reset switch, the switching control circuit being connected to the detection signal conductor wire at the input end of the cord, the switching control circuit controlling the reset switch to disconnect the current-carrying wires from the input terminals based on the open or closed stated of the temperature controlled switch.

2. The device of claim 1, wherein the switching control circuit comprises a silicon controlled rectifier, the detection signal conductor wire being coupled to a control electrode of the silicon controlled rectifier.

3. The device of claim 2, wherein the switching control circuit further comprises a first resistor connected between the control electrode of the silicon controlled rectifier and the input end of the detection signal conductor wire.

4. The device of claim 3, wherein the switching control circuit further comprises a second resistor connected between a phase or neutral wire and the detection signal conductor wire at the input end.

5. The device of claim 2, wherein the switching control circuit is a leakage current detection interrupter circuit.

6. The device of claim 2, wherein the switching control circuit is an arc fault circuit interrupter circuit.

7. The device of claim 1, wherein the temperature controlled switch includes:
   a temperature-sensitive metal plate and a conductive terminal, wherein the temperature-sensitive metal plate is electrically connected or disconnected from the conductive terminal based on temperature induced deformation.

8. The device of claim 7, wherein the temperature controlled switch further includes:
   a casing accommodating the temperature-sensitive metal plate and the conductive terminal;
   a sealing plate, having holes for respectively passing two conductors which are electrically coupled to the temperature-sensitive metal plate and the conductive terminal respectively;
   wherein the sealing plate and the casing are joined together to form a sealed space for accommodating the switching unit.

9. The device of claim 1, wherein the temperature controlled module has a plurality of temperature controlled switch each adapted to be disposed on a device under measurement, each temperature controlled switch being coupled between the leakage current detection wire and either the phase wire or the neutral wire of the current-carrying wires, each temperature controlled module changing its connection state based on a detected temperature of the respective device under measurement.

10. The device of claim 1, wherein the temperature controlled switch has a fixing member on its surface to connect the temperature controlled switch and the device under measurement.

* * * * *